United States Patent [19]

Danger

[11] Patent Number: 5,633,608
[45] Date of Patent: May 27, 1997

[54] DIGITAL DELAY LINE

[75] Inventor: Jean-Luc Danger, Paris, France

[73] Assignee: SGS-Thomson Microelectronics S.A., Saint Genis Pouilly, France

[21] Appl. No.: 306,488

[22] Filed: Sep. 15, 1994

[30] Foreign Application Priority Data

Sep. 27, 1993 [FR] France ............... 93 11750

[51] Int. Cl.⁶ ............... H03K 5/13; H03K 5/159
[52] U.S. Cl. ............... 327/270; 327/276; 327/152; 327/158; 327/161; 327/244
[58] Field of Search ............... 327/276, 277, 327/270, 269, 263, 265, 233, 231, 234, 235, 236, 243, 244, 245, 250, 251, 149, 152, 151, 153, 158, 160, 161, 407

[56] References Cited

U.S. PATENT DOCUMENTS

| | | | |
|---|---|---|---|
| 4,677,499 | 6/1987 | Shirota et al. | 358/339 |
| 4,737,670 | 4/1988 | Chan | 307/602 |
| 4,845,390 | 7/1989 | Chan | 307/602 |
| 5,043,596 | 8/1991 | Masuda et al. | 327/250 |
| 5,087,829 | 2/1992 | Ishibashi et al. | 327/152 |
| 5,118,975 | 6/1992 | Hillis et al. | 327/158 |
| 5,122,761 | 6/1992 | Wischermann | 327/158 |
| 5,146,121 | 9/1992 | Searles et al. | 327/244 |
| 5,162,746 | 11/1992 | Ghoshal | 327/244 |
| 5,210,450 | 5/1993 | Parkinson | 327/152 |
| 5,252,867 | 10/1993 | Sorrells et al. | 307/606 |
| 5,258,660 | 11/1993 | Nelson et al. | 327/269 |
| 5,260,608 | 11/1993 | Marbot | 327/263 |
| 5,272,729 | 12/1993 | Bechade et al. | 327/231 |
| 5,281,874 | 1/1994 | Sorrells et al. | 307/606 |

FOREIGN PATENT DOCUMENTS 0553744 8/1993 European Pat. Off. ......... H03K 5/13

*Primary Examiner*—Timothy P. Callahan
*Assistant Examiner*—Eunja Shin
*Attorney, Agent, or Firm*—David M. Driscoll; James H. Morris

[57] ABSTRACT

A digital delay line supplies from a periodic input signal n signals with the same period mutually shifted by one n-th of the input signal period. The digital delay line includes n cells, each of which includes m delay elements in series, each output of a delay element being connected to an input of a multiplexer. The output phase of the n-th cell is compared with that of the input signal phase. The output of a multiplexer of the n cells is modified after each comparison.

19 Claims, 4 Drawing Sheets

DIGITAL DELAY LINE

BACKGROUND OF THE INVENTION

1. Field of the Invention

The present invention relates to a digital delay line usable in particular in a voltage controlled oscillator (VCO) of a phase-locked loop (PLL) system.

2. Discussion of the Related Art

FIG. 1 is a diagram of a conventional embodiment of a digital VCO. The oscillator is controlled by a clock signal with frequency fx provided by a crystal, for example with a frequency of 270 MHz. The clock signal is provided to the clock input of a register 1. Registers or memories 2 and 3 store programmable respective values Q and P which are adjusted by the control signals of the VCO. The content of register 2 is transferred through an adder 4 to the D input of register 1 at the clock rate. The output Q of register 1 is provided to a first input of a digital comparator 5 and to a second input of the adder 4. The second input of comparator 5 receives the output P of register 3, and the comparator output provides the desired signal CLK and is applied as a reset input to register 1. Register 1 and adder 4 form an accumulator which is incremented by value Q at each clock pulse fx. So, when the multiplication of number Q has reached the value P, the comparator provides one signal pulse CLK. Therefore, this signal has a frequency $F_{CLK}=(Q/P)fx$. Of course, this involves that P is higher than Q and even higher than 2Q. However, in fact, this circuit does not provide the frequency fx multiplied by Q/P but by the closest integer value higher than Q/P. In other words, there is a jitter of the same order of magnitude as the period of frequency fx.

To increase the oscillator accuracy and decrease the jitter, the frequency fx should be increased or the frequency $F_{CLK}$ should be smoothed at the oscillator output. In both cases, this involves the addition of an analog PLL to multiply the crystal frequency or to filter the oscillator's jitter. The use of such an analog loop is in contradiction with the realization of a fully digital VCO.

To solve this problem, it has already been proposed in the prior art (refer, for example, to IEEE Journal of Solid-State Circuits, Vol. 25, No. 6, December 1990, pp. 1385–1394) to provide, as indicated in FIG. 2, from signals at frequency fx of a crystal, a plurality of signals phase-shifted by one n-th of the corresponding period, to provide respective signals of phase 1, of phase 2 ... and of phase n. Then, as represented in FIG. 3, if the phase-i signal is used to provide one period of signal CLK, phase-i+1 signal (or another signal) can be used to generate the next period. In this case, the accuracy or jitter corresponds to the input signal period divided by the number of phases.

As represented in FIG. 4, the n phases can be introduced, for example, on n inputs of a multiplexer 10 used to generate the signal CLK. Multiplexer 10 is scanned at a variable frequency Fs to provide the frequency shift. Frequency Fs is directly proportional to the correction factor incoming from a filter stage normally integrated in a PLL. A bit rate multiplier 11, BRM, is designed to transfer the correction word in a scanning signal. The output of multiplier 11 is provided to an up-down counter (UDC) 12, whose up-counting or down-counting operation is determined by the most significant bit (MSB) which is the sign bit of the correction value of the filter.

In such a system, one problem lies in the realization of n signals accurately phase-shifted from signal fx. Up to now, and as indicated in the above mentioned article, these n shifted signals can be provided by a ring counter. However, the frequency of this ring counter has to be controlled to be independent of the manufacturing process, of temperature and of variations in the voltage parameters. Again, this control step involves the use of analog techniques.

SUMMARY OF THE INVENTION

Thus, an object of the present invention is to provide an implementation using only digital technologies to obtain n shifted signals from an input signal. In other words, the present invention aims to realize a programmable digital delay line allowing the provision of n signals delayed by 1/n times the period with respect to an input signal having a predetermined period.

To achieve this object, the present invention provides a digital delay line to supply from a periodic input signal n signals with the same period mutually phase-shifted by one n-th of the input signal period, including n cells, each of which includes m serial delay elements, each output of a delay element being connected to a multiplexer input; means for comparing the output phase of the n-th cell with the input signal phase; and means for modifying the multiplexer output further to each comparison.

According to an embodiment of the invention, each multiplexer is formed by m-1 two-input multiplexers, the multiplexer with the highest rank receiving the outputs of the last two delay elements, and the multiplexers of lower rank receiving the output of the multiplexer having the immediately former rank and the output of a delay element having a rank lower than the delay element processed by the multiplexer of higher rank.

According to an embodiment of the invention, each delay element includes an NAND gate having an input that receives the signal to be delayed and the other input that receives an enabling signal.

According to an embodiment of the invention, the enabling signal is used as a test signal.

According to an embodiment of the invention, the enabling signal is used as an inhibition signal for the cell delay elements that are not used.

The foregoing and other objects, features, aspects and advantages of the invention will become apparent from the following detailed description of the present invention when taken in conjunction with the accompanying drawings.

DETAILED DESCRIPTION

Figure 1:
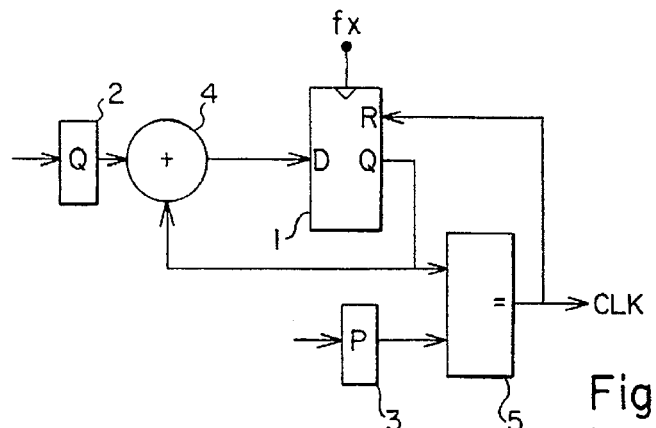
FIGS. 1–4, above described, illustrate the state of the art and the problem that is encountered.
Figure 2:
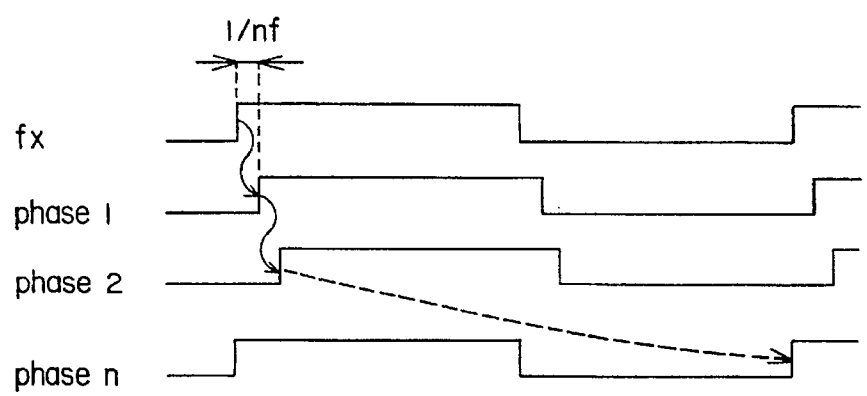
Figure 3:
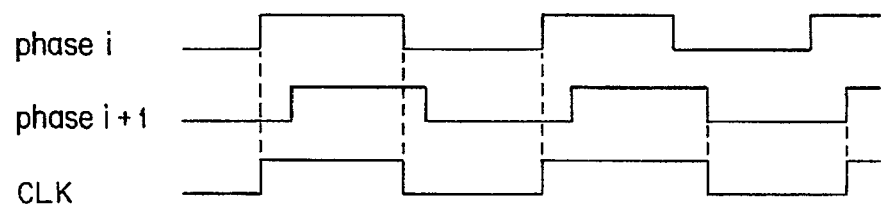
Figure 4:
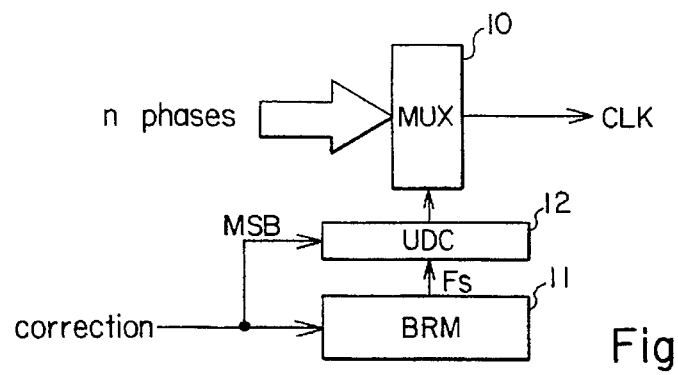
Figure 5:
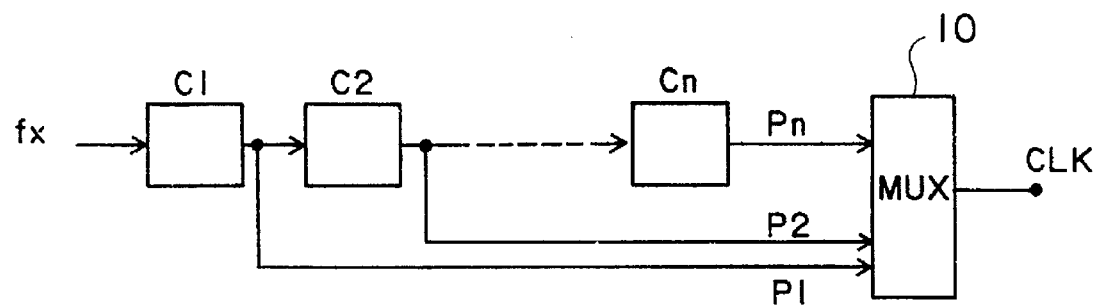
FIG. 5 represents a digital delay line according to the present invention.

As represented in FIG. 5, the present invention provides the use of a digital delay line including n cells C1, C2 . . . Ci . . . Cn each providing a signal delayed with respect to an input signal fx, that is, signals P1, P2 . . . Pi . . . Pn, to the inputs of a multiplexer It should be noted that this delay line forms an open loop and not a ring looped circuit.

Figure 6:
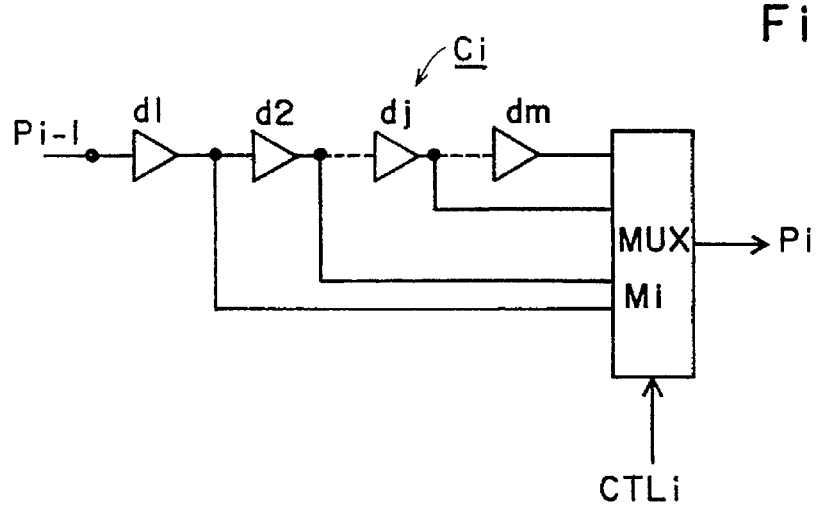
FIG. 6 represents a cell of a digital delay line according to the present invention.

FIG. 6 represents an embodiment of a cell Ci of the delay line of FIG. 5. Cell Ci includes m delay elements d1, d2 . . . dj . . . dm. The first delay element d1 receives the output Pi-1 of the preceding cell and the output of each of the delay elements dj is provided to the input of a multiplexer hi, whose output corresponds to signal Pi and is provided to the next cell input (and to multiplexer 10).

In this embodiment, each delay element dj exhibits the same delay time d. Thus, by selecting through multiplexer Mi the output signal of one of the delay elements d1-dm, the delay between signals Pi-1 and Pi is equal to j*d and may vary between d and m*d.

Each multiplexer Mi receives a control signal CTLi provided in the way described hereinafter.

Multiplexers Mi are connected to a pointer which addresses each of those multiplexers sequentially, in the order from the first to the last one or, as it will be seen hereinafter, in any other selected order, but so that all the multiplexers are pointed at before a multiplexer is pointed at a second time. Each time a determined multiplexer is pointed at, the order number of its input is incremented or decremented as a function of the result of a comparison between the output Pn of the n-th cell and signal fx.

Once the delay line according to the present invention is preadjusted close to the selected adjustment, its adjustment is unlikely to vary, except in response to variations in temperature or in the frequency fx.

Figure 7:
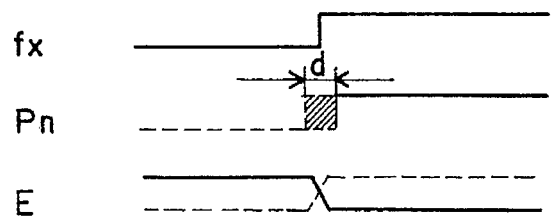
FIG. 7 is a timing diagram illustrating some characteristics of the digital delay line according to the invention.

So, as represented in FIG. 7, when the system is substantially locked on its normal operating point, the difference between the rising edges of signal fx and signal Pn is at most equal to a value ±d. Therefore, a positive (1) or negative (0) error E is detected.

At each detection of an error E, one of the multiplexers is incremented or decremented. During the next detection, the error is normally reversed and the pointed multiplexer should conversely be incremented or decremented.

Of course, as indicated above, pointing is realized so that, at a determined time, a difference higher than d never occurs between the delays provided by two distinct cells. Thus, a system with a permanent adjustment is obtained. It should be noted that the rate of the comparisons between fx and Pn is not necessarily very high and can be of several clock periods since the synchronization parameters slowly vary over the time during a normal operation of the system.

During the initialization phase of the operation of the delay line according to the invention, each cell C1-Cn is automatically set at its minimum delay and, from this moment, the delay of each cell is incremented until an error varying between one incrementation and one decrementation is found. Then, the steady state operation described with relation to FIG. 7 is obtained.

Figure 8:
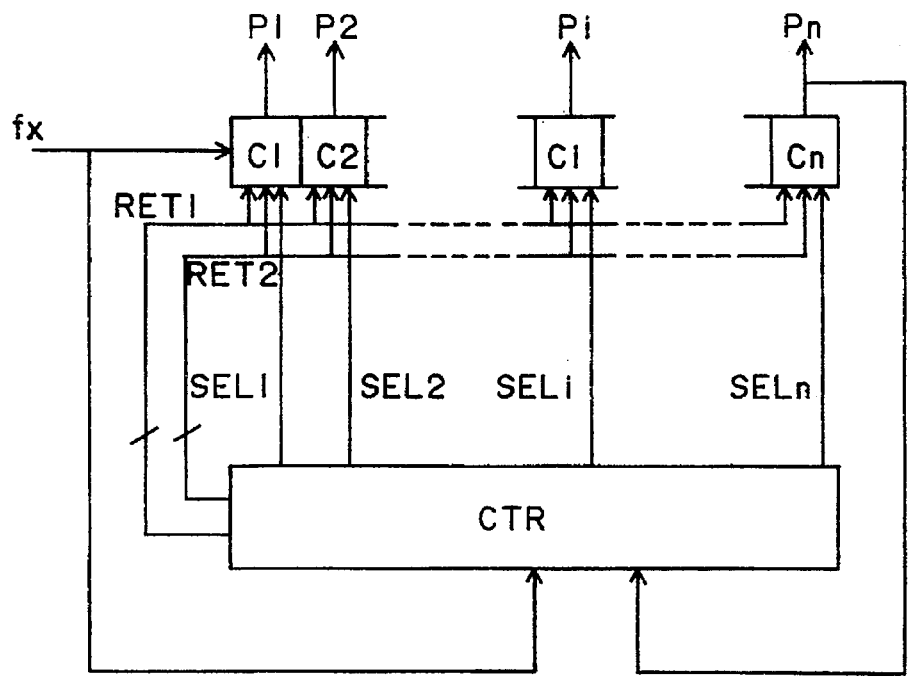
FIG. 8 represents a circuit for controlling a digital delay line according to the invention.

FIG. 8 shows an embodiment of the control circuit of the plurality of delay cells C1-Cn according to the invention. Each cell provides a respective signal P1, P2 . . . Pn to the multiplexer 10. A control circuit CTR is designed to control each cell and more precisely to control decoders associated with each multiplexer Mi of those cells. As indicated above, the control circuit CTR receives the input signal fx and the output signal Pn and determines whether the delay of a cell at a given time has to be incremented or decremented as a function of the sign of the difference E between signals fx and Pn. In the represented embodiment, the control circuit provides outputs SEL1, SEL2 . . . SELn for selecting each cell C1, C2 . . . Cn and values RET1 and RET2 which differ one with respect to the other by one unit. These values determine the delay of each cell, that is, the input number of the multiplexer Mi that has to be connected to its output Pi. A cell Ci will be controlled by signal RET1 or signal RET2 depending upon the value SELi applied thereto. Thus, the delays provided by each cell differ at most by one elementary delay d. The control circuit CTR includes logic means for causing signals RET1 and RET2 to change their state when all the signals SEL1-SELn have all identical value, that is, all the cells exhibit an identical delay.

Accordingly, starting from an initial state when all the cells are set at their minimum delay, the initial values of the pair RET1, RET2 will be (RET1, RET2)=(1, 2). Then, when all signals SELi go to 1, the pair (RET1, RET2) goes to (2, 3); then, when all signals SELi are at 0, the pair (RET1, RET2) goes to (3, 4), and so on until (m-1, m) if it is needed to obtain the maximum delay. It should be noted that, when signals SELi are caused to go from 0 to 1, or from 1 to 0, the changes must be carried out in a balanced manner so that the cell Ci generates a signal Pi having a phase as close as possible to $(2+i/n)\pi$. To achieve this purpose, the delays of cells C1-Cn should not change sequentially over time. One of the best variation mode consists in sequentially selecting the following signals (in the case when n is a power of 2): SEL1, SELn/2, SELn/4, SEL3n/4, SELn/8, SEL5n/8, SEL3n/8, SEL7n/8 . . .

Frequency range and jitter

The jitter inherent in the delay line is d since it has been seen that Pn was subject to a jitter ±d with respect to fx. The current existing CMOS technologies provide delay elements d whose delay time is usually 0.5–1 nanosecond, which allows for a tolerable jitter for a wide range of applications.

The frequency range of the delay line depends upon the number n of cells Ci, upon the number m of delay elements dj for each cell and upon the technology that is used. Considering that in a conventional MOS process in which an elementary delay d is desired, this delay can in fact vary between d/2 (best case) and 2d (worst case). Therefore, the total delay of the delay line can vary between n*d/2 and m*n*d/2 in the best case and between n*2d and m*n*2d in the worst case. To allow the phase generator to lock in all cases, the total delay of the delay line must be comprised within 2n*d and n*m*d/2.

Since the period fx of utilization is thus limited, the frequency range with the minimum frequency of fmin=2/m*n*d and the maximum frequency of fmax=1/n*2d results.

By way of example, in a case where m=8, n=76, d=0.8 ns, one obtains fmin=19.5 MHz, fmax=39 MHz, the jitter being equal to d=0.8 ns.

If the phase generator is used in a digital VCO architecture, the jitter inherent in VCOs is 1/n times the crystal frequency, that is, 1/nfx. Since a priori no time relation exists between the correction of the phase generator (having a jitter d), and the jitter inherent in the PLL, the total jitter, J, is:

$$J=[(1/nfx)^2+d^2]^{1/2},$$

whereby, in the above example:

$$1.12<J<2.62 \text{ ns.}$$

Exemplary embodiment

Figure 9:
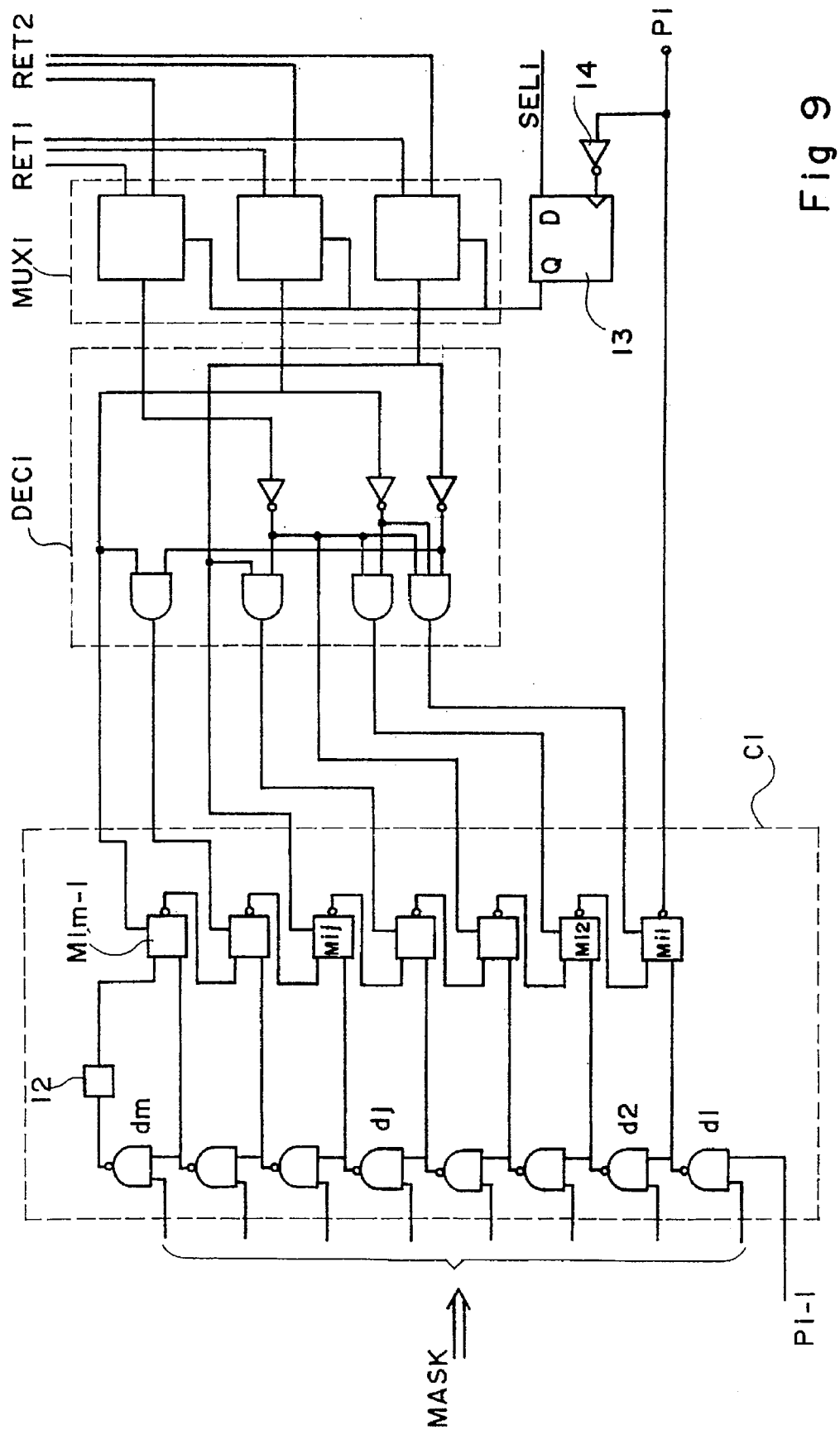
FIG. 9 represents an embodiment of a cell of a digital delay line according to the invention.

FIG. 9 represents only by way of example an embodiment of a cell such as the one of FIG. 6, associated with a control circuit such as the one of FIG. 8. Each delay element dj includes an NAND gate and one considers the specific case when the number of delay elements is m=8. The first input of each NAND gate is connected to the output of the NAND gate of lower rank, the gate d1 receiving signal Pi-1. The output of each NAND gate is also provided to the first input of a two-way multiplexer $M_{ij}$ whose second input receives the output of the multiplexer of higher rank, except the last multiplexer $M_{im-1}$ which receives the output of the NAND gate dm. In fact, considering the delay of each delay element, the transition in the corresponding multiplexer must be taken in account. Thus, after the NAND gate dm, a delay element 12 is added. Each multiplexer $M_{i1}$ to $M_{im-1}$ receives control signals from a decoding circuit DECi controlled by a plurality of multiplexers MUXi that receive signals RET1, RET2 and SELi from a control circuit such as the circuit CTR of FIG. 8. A specific exemplary embodiment of blocks MUXi et DECi is illustrated in the drawing where conventional symbols represent multiplexers, inverters and AND gates. This specific embodiment will not be described in detail because many alternative approaches are possible. The object of these circuits is to provide control signals to the multiplexers Mij so as to set in a first state multiplexers $M_{il}$ to $M_{ik}$ and in a second state multiplexers $M_{ik}$ to $M_{im-1}$ in relation to the value of signal RET1 or RET2.

Each NAND gate d1-dm receives at its second input a signal corresponding to a conductor of a bus MASK. The signals of this bus MASK can be used for testing the operation of the circuit by imposing selected signals to the output of each NAND gate. Preferably, the bus MASK will be used during the operation of cell Ci to inhibit the NAND gates of this cell that are not used. This allows to minimize the power consumption.

Moreover, the use of NAND gates constituting series inverting cells makes it possible to balance the delays on the rising edge and the falling edge. The duty cycle of signal Pi will thus be little affected by its passage through cell Ci. In addition, the rank change of multiplexer Mi including elementary two-input multiplexer $M_{i1}$ to $M_{im-1}$ is carried out without undetermined switching since the transition from multiplexer $M_{ij}$ to multiplexer $M_{ij+1}$ requires only one transition on the control signal of this multiplexer.

Glitches

It should be noted that the device according to the invention uses many multiplexing circuits. One of the problems resulting from the use of a multiplexer is correlated with the switching time which must be such that no glitch occurs at the output.

Figure 10:
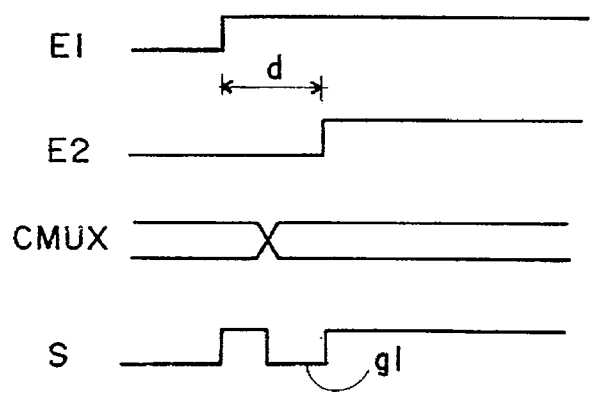
FIG. 10 represents signals liable to occur while the multiplexer is being controlled.

As shown in FIG. 10, in a multiplexer with two inputs E1 and E2, whose rising edges are for example spaced by value d, if a control signal CMUX of the multiplexer, which tends to switch the outputs between the rising edges of inputs E1 and E2, is applied, a parasitic negative pulse or glitch GL will appear on the output signal S. In the above described multiplexer Mi, the delay between two inputs is d. If the multiplexer control is synchronized with input 1 and if the control is delayed by at least value d with respect to this input 1, no glitch will occur. That is why, as represented in FIG. 9, a D-type flip-flop 73 is used for the synchronization of signal SELi. The delay of flip-flop 13, of multiplexer MUXi and of decoder DECi is selected higher than d. Since the signals (RET1, RET2, SELi) generated by the control block are synchronized with frequency fx, the synchronization flip-flop of signal SELi may exhibit metastable states.

To avoid this drawback, the rising edge of Pi is used for cells having a high phase up to Cn and the falling edge of Pi is used for cells having a low phase (from C1). Thus, for the low phase cells, it is provided to insert an inverter 14 between the output of signal Pi and the synchronization input of flip-flop 13.

Figure 11:
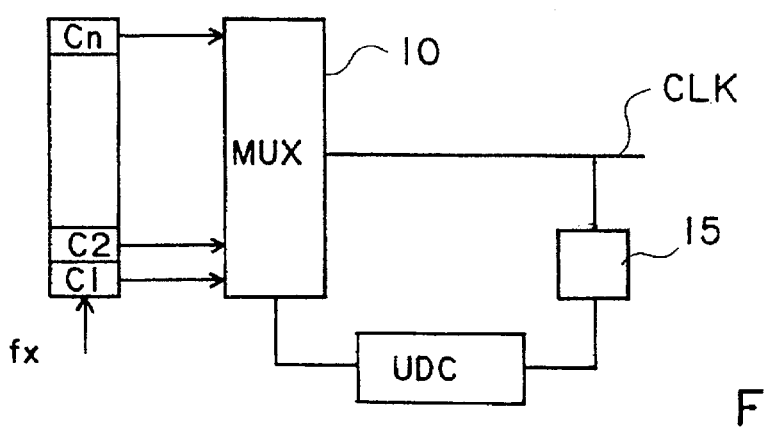
FIG. 11 represents a timing circuit associated with the control of a multiplexer.

In the application of the present invention to a digital VCO, the problem of the glitch inherent in the multiplexing is still present. Thus, FIG. 11 illustrates a method for synchronizing the multiplexer 10. The control of multiplexer 10 through an up/down counter UDC is synchronized with the output CLK of this multiplexer and is delayed by a delay equal to that of a cell Ci imposed by a delay circuit As is apparent to those skilled in the art, the digital balanced delay line according to the invention is liable of various applications. As indicated above, the digital delay line can be used for the realization of a VCO for use in a PLL, for example in a video PLL in which frequency fx is 32 MHz and in which the jitter is shorter than 5 nanoseconds. The digital delay line can also be used to compensate for the delay of signals caused by the line problems existing in printed circuits. The digital delay line can also be used to determine, and therefore to recover, the phase of some asynchronous or desynchronized signals in the field of telecommunications.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A digital delay line to supply from a periodic input signal n signals with the same period mutually phase-shifted by one n-th of the input signal period, including:

n cells each of which includes m delay elements in series, each output of a delay element being connected to an input of a multiplexer, each multiplexer having an output that is one of the n signals;

means for comparing the output phase of the n-th cell with the input signal phase to provide an error signal; and means for modifying the output of the multiplexer of one of the n cells in response to the error signal;

wherein each multiplexer is formed by m-1 two-input multiplexers of different rank, a two-input multiplexer with a highest rank receiving the outputs of the last two delay elements in series, and each respective two-input multiplexer of lower rank receiving the output of a two-input multiplexer having an immediately higher rank and the output of a delay element having a rank lower than the delay element processed by the two-input multiplexer of immediately higher rank.

2. A digital delay line to supply from a periodic input signal n signals with the same period mutually phase-shifted by one n-th of the input signal period, including:

n cells each of which includes m delay elements in series, each output of a delay element being connected to an input of a multiplexer, each multiplexer having an output that is one of the n signals;

means for comparing the output phase of the n-th cell with the input signal phase to provide an error signal; and means for modifying the output of the multiplexer of one of the n cells in response to the error signal;

wherein each delay element is formed by a NAND gate having an input that receives the signal to be delayed and the other input that receives an enabling signal.

3. The delay line of claim 2, wherein the enabling signal is used as a test signal.

4. The delay line of claim 2, wherein the enabling signal is used as an inhibition signal for the not-used delay elements of a cell.

5. The delay line of claim 1, wherein control signals, that are determined by the error signal and that select the output of a multiplexer, are delayed with respect to a respective cell input signal by inputting the control signals through a control signal delay element that is coupled to the multiplexer.

6. A delay line that receives an input clock signal, having a period, to provide n output signals, the delay line comprising:

an input terminal that receives the input clock signal;

n output terminals, each output terminal providing a respective one of the n signals;

n cells, electrically coupled to the input terminal, each one of the n cells coupled to a respective one of the n output terminals, and each cell receiving a cell input signal and providing a phase shift to the cell input signal to generate a cell output signal as a respective one of the n output signals, wherein each one of the n cells comprises:

a series of m delay elements, each delay element providing a delayed output signal, a first delay element of the series receiving the cell input signal of the one of the n cells, and each delay element, aside from the first delay element, receiving the delayed output signal of a prior delay element in the series, wherein the series of m delay elements includes:

a series of m NAND gates, each NAND gate having two input terminals and an output terminal that provides the delayed output signal, a first NAND gate of the series receiving the cell input signal at a first one of the two input terminals, and each NAND gate aside from the first NAND gate receiving the delayed output signal of a prior NAND gate in the series at a first one of the two input terminals; and m mask terminals, each one of the mask terminals being coupled to a respective one of the second one of the two input terminals of the m NAND gates; and a multiplexing unit coupled to each one of the m delay elements, the delayed output signal of the m delay elements being received as inputs by the multiplexing unit, a control signal selecting one delayed output signal from the inputs to be an output of the multiplexing unit, the output of the multiplexing unit being the cell output signal of the one of the n cells; and a control circuit coupled to the n cells that adjusts the phase shift through at least one of the n cells so that the phase shift through the at least one cell is substantially the period of the input clock signal divided by n.

7. The delay line according to claim 6, wherein signals are applied to the m mask terminals such that NAND gates of the m NAND gates that are not needed for an amount of delay as determined by the control circuit are turned off in order to minimize a consumption of power.

8. The delay line according to claim 6, wherein signals are applied to the m mask terminals to test operation of the delay line.

9. The delay line according to claim 6, wherein the multiplexing unit comprises:

a series of m-1 multiplexers, each multiplexer having two input terminals, a select terminal, and an output terminal, a first one of the two input terminals of the m-1 multiplexers being coupled to the output terminal of a respective one of first m-1 NAND gates in the series of the m NAND gates, a second one of the two input terminals of a last multiplexer in the series of the m-1 multiplexers being coupled to the output terminal of a last NAND gate in the series of m NAND gates, a second one of the two input terminals of the multiplexers, aside from that of the last multiplexer, being coupled to the output terminal of a successive multiplexer in the series of the m-1 multiplexers, the output terminal of a first multiplexer of the series of the m-1 multiplexers being coupled to the cell output terminal of the one of the n cells; and a decoding circuit, coupled to the control circuit and the select terminals of the m-1 multiplexers, that receives control signals from the control circuit to select one of the two inputs in each one of the m-1 multiplexers such that a total delay provided by the one of the n cells is substantially the period of the input clock signal divided by n.

10. The delay line according to claim 9, further comprising a delay unit coupled between the output terminal of the last NAND gate and the second one of the two input terminals of the last multiplexer such that outputs of the m-1 multiplexers are settled to a predetermined state before a change in the control signals readjusts the total delay through the one of the n cells.

11. The delay line according to claim 9, wherein the multiplexing unit further comprises a d flip flop, having a synchronization input, coupled to the decoding circuit and the control circuit, that delays a change in a selecting control signal at the control circuit to prevent an adjustment of the total delay through the one of the n cells before inputs to the multiplexers are settled to predetermined states determined by the selecting control signal before the change.

12. The delay line according to claim 11, wherein the multiplexing unit further comprises:

an inverter coupled between the cell output terminal and the synchronization input of the d flip flop for the low phase cells of the n cells, that provide a low phase shift to the cell output signal from the input clock signal, to inhibit metastable states in the d flip flop.

13. A delay line that receives an input clock signal, having a period, to provide n output signals, the delay line comprising:

an input terminal that receives the input clock signal;

n output terminals, each output terminal providing a respective one of the n signals;

n cells, electrically coupled to the input terminal, each one of the n cells coupled to a respective one of the n output terminals, and each cell receiving a cell input signal and providing a phase shift to the cell input signal to generate a cell output signal as a respective one of the n output signals; and a control circuit coupled to the n cells that adjusts the phase shift through at least one of the n cells, by providing respective control signals, to each cell, that select a respective number of digital delay elements that the cell input signal propagates through, so that the phase shift through each of the at least one cell is substantially the period of the input clock signal divided by n;

wherein the control circuit compares the phase of the output signal of one of the n cells and of the input clock signal to provide an error signal and modifies the phase shift through at least one of the n cells based on the error signal, and wherein the control circuit further includes at least one select line coupled to the n cells for selecting at least one cell of the n cells to modify the phase shift provided by the at least one cell; and at least one control line coupled to the n cells for sending control signals that determine an amount of phase shift through the at least one cell.

14. A method of generating n signals given an input clock signal having a period, the method including the steps of:

A. receiving the input clock signal;

B. phase-shifting the input clock signal to generate n signals, each one of the n signals having a respective phase shift;

C. forming an error signal, the error signal indicating whether each of the n signals are successively phase shifted from each other by substantially the period of the input clock signal divided by n;

D. selecting a respective number of digital delay elements that each signal propagates through to set the respective phase shift, based on the error signal, so that each of the n signals are successively phase-shifted from each other by more substantially the period of the input clock signal divided by n; and delaying the step of selecting upon a change in the error signal until the n-signals are at respective predetermined states determined by the error signal before the change.

15. A delay line that receives an input clock signal having a period to provide n signals, each one of the n signals having a respective phase shift from the input clock signal, the delay line comprising:

an input terminal that receives the input clock signal;

a series of n output terminals, each output terminal providing a respective one of the n signals;

n cells coupled to the input terminal and each one of the n cells coupled to a respective one of the n output terminals;

means for maintaining a phase shift of a first signal of the n signals from a second signal of the n signals substantially at the period of the input clock signal divided by n, by selecting a respective number of digital delay elements in each of the n cells; and means for preventing glitches in the n signals by delaying control signals provided by the means for maintaining before the control signals reach the n-cells.

16. A delay line that receives an input clock signal having a period to provide n signals, each one of the n signals having a respective phase shift from the input clock signal, the delay line comprising:

an input terminal that receives the input clock signal;

a series of n output terminals, each output terminal providing a respective one of the n signals;

n cells coupled to the input terminal and each one of the n cells coupled to a respective one of the n output terminals;

means for maintaining a phase shift of a first signal of the n signals from a second signal of the n signals substantially at the period of the input clock signal divided by n; and means for minimizing a power consumption in the delay line.

17. A delay line that receives an input clock signal having a period to provide n signals, each one of the n signals having a respective phase shift from the input clock signal, the delay line comprising:

an input terminal that receives the input clock signal;

a series of n output terminals, each output terminal providing a respective one of the n signals;

n cells coupled to the input terminal and each one of the n cells coupled to a respective one of the n output terminals;

means for maintaining a phase shift of a first signal of the n signals from a second signal of the n signals substantially at the period of the input clock signal divided by n; and means for inhibiting metastable states in the delay line that is implemented digitally.

18. A delay line that receives an input clock signal having a period to provide n signals, each one of the n signals having a respective phase shift from the input clock signal, the delay line comprising:

an input terminal that receives the input clock signal;

a series of n output terminals, each output terminal providing a respective one of the n signals;

n cells coupled to the input terminal and each one of the n cells coupled to a respective one of the n output terminals;

means for maintaining a phase shift of a first signal of the n signals from a second signal of the n signals substantially at the period of the input clock signal divided by n, by providing respective control signals to each of the n cells individually via control terminals, each cell having control terminals that are separate and distinct from control terminals of other cells such that each cell can be controlled individually; and means for preventing glitches in the n signals by delaying signals provided by the means for maintaining before the signals reach the n-cells.

19. A delay line that receives an input clock signal having a period to provide n signals, each one of the n signals having a respective phase shift from the input clock signal, the delay line comprising:

an input terminal that receives the input clock signal;

a series of n output terminals, each output terminal providing a respective one of the n signals;

n cells coupled to the input terminal and each one of the n cells coupled to a respective one of the n output terminals;

means for maintaining a phase shift of a first signal of the n signals from a second signal of the n signals substantially at the period of the input clock signal divided by n, by providing respective control signals to each of the n cells individually via control terminals, each cell having control terminals that are separate and distinct from control terminals of other cells such that each cell can be controlled individually; and means for minimizing a power consumption in the delay line.

* * * * *

UNITED STATES PATENT AND TRADEMARK OFFICE
CERTIFICATE OF CORRECTION

PATENT NO. : 5,633,608
DATED : May 27, 1997
INVENTOR(S): Jean-Luc Danger

It is certified that error appears in the above-identified patent and that said Letters Patent is hereby corrected as shown below:

On the title page, item [73] should read:

[73] Assignees: SGS-Thomson Microelectronics S.A., Saint Genis, France and NOKIA Technology GmbH, Pforzheim, Germany Signed and Sealed this Eighth Day of February, 2000

*Attest:*

Q. TODD DICKINSON

*Attesting Officer*  Commissioner of Patents and Trademarks